United States Patent [19]

Harada et al.

[11] Patent Number: 5,369,220
[45] Date of Patent: Nov. 29, 1994

[54] WIRING BOARD HAVING LAMINATED WIRING PATTERNS

[75] Inventors: Keizo Harada; Takatoshi Takikawa; Takao Maeda; Shunsuke Ban; Shosaku Yamanaka, all of Itami, Japan

[73] Assignee: Sumitomo Electric Industries Ltd., Osaka, Japan

[21] Appl. No.: 949,474

[22] PCT Filed: Feb. 24, 1992

[86] PCT No.: PCT/JP92/00198
§ 371 Date: Oct. 23, 1992
§ 102(e) Date: Oct. 23, 1992

[87] PCT Pub. No.: WO92/15117
PCT Pub. Date: Sep. 3, 1992

[30] Foreign Application Priority Data

Feb. 25, 1991 [JP] Japan ................................ 3-030185
Mar. 20, 1991 [JP] Japan ................................ 3-056522
Mar. 20, 1991 [JP] Japan ................................ 3-056556

[51] Int. Cl.$^5$ ............... H01L 39/02; H01L 23/48; H01L 29/46; H01L 29/62
[52] U.S. Cl. ........................ 174/257; 257/767
[58] Field of Search ......... 257/766, 771, 765, 723, 257/724, 677, 767; 174/254, 256, 268, 257, 261, 250, 264

[56] References Cited

U.S. PATENT DOCUMENTS

| 4,109,297 | 8/1978 | Lesh ................................ 257/766 |
| 4,420,364 | 12/1983 | Nukii et al. . |
| 4,620,264 | 10/1986 | Ushifusa et al. .......... 174/261 |
| 4,840,924 | 6/1989 | Kinbara ..................... 174/261 |

FOREIGN PATENT DOCUMENTS 56-167339  5/1980  Japan .
59-167038  3/1983  Japan .
61-239651  10/1986  Japan .

OTHER PUBLICATIONS

The Abstract of JP 52-115175 as provided by Database WPI, Section Ch, Week 7745, Derwent Publications Ltd., London, GB; Class 103, AN 77-80149Y.

Primary Examiner—Sara W. Crane
Assistant Examiner—S. V. Clark
Attorney, Agent, or Firm—Wenderoth, Lind & Ponack

[57] ABSTRACT

A wiring board has a wiring circuit which is reliable and which can be easily miniaturized, and used for the production of a highly integrated, lighter, thinner, shorter, smaller and low-cost semiconductor device. This wiring board can be sealed in a plastic package. The wiring board has a metal plate and a thin-film dielectric layer formed on the surface of the metal plate. A semiconductor device is mounted on the surface of the dielectric layer or the exposed surface of the metal plate. Film wirings are formed on the dielectric layer. Each film wiring is in the form of a laminate formed by laminating, by vapor phase deposition or by plating, a an aluminum conductive layer, an adhesive layer of chromium, titanium or a laminate thereof, a diffusion barrier layer of nickel, copper or a laminate thereof, and a corrosion-preventive and wire bonding layer of gold. Such wirings may alternatively be in the form of a laminate formed by laminating an adhesive layer of chromium, aluminum, titanium or a laminate comprising at least two of such materials, a copper conductive layer, and a gold layer, or in the form of a laminate formed by laminating an aluminum conductive layer, a barrier layer of nickel, and a gold layer. Since the film wirings can be miniaturized easily, the density of the wirings can be increased. Also, since the wirings are made of aluminum or copper, they are inexpensive.

12 Claims, 1 Drawing Sheet

WIRING BOARD HAVING LAMINATED WIRING PATTERNS

BACKGROUND OF THE INVENTION

1. Field of the Invention

The present invention relates to a wiring board on which electrical elements such as semiconductor elements are mounted.

2. Description of the Related Art

There are known numerous products equipped with signal or power source wirings including functional elements such as semiconductor elements. Such known products include hybrid IC's and various IC packages. In recent days, new products have been developed in which an alumina wiring board or a printed wiring board provided with Ag-Pd wirings formed by screen printing is mounted in a so-called plastic package which utilizes lead frames and resin sealing and which is easy to mass produce and can be manufactured at low costs. These products can carry a plurality of elements.

Efforts are now being made to develop more highly integrated semiconductor devices which are lighter, thinner, shorter, smaller and less expensive. A wiring board which can meet such requirements and can be built into a plastic package is required. But, the above-described alumina wiring board has a problem in that it is difficult to increase its density and reduce its thickness beyond a certain point by reducing the wire diameter. The same is true with the printed wiring board. Also, the printed wiring board has another problem in that when mounting elements, especially when bonding with wires, the adhesive tends to soften.

An object of the present invention is to provide a wiring board which is free of the above problems and which satisfies the above requirements.

In order to solve the above problems, according to the present invention, there is provided a wiring board comprising a metal plate made of a lead frame material, a thin-film dielectric layer formed on the surface of the metal plate, an electric element being adapted to be mounted on the surface of the dielectric layer or on an exposed surface of the metal plate, and signal and/or power source wiring layers on the dielectric layer.

Each wiring layer should be in the form of (1) a laminate formed by laminating, by vapor phase deposition or by plating, a conductive layer of aluminum, an adhesive layer made of chromium, titanium or a laminate thereof, a diffusion barrier layer made of nickel, copper or a laminate thereof, and a corrosion-preventive and wire bonding layer made of gold, (2) a laminate formed by laminating, by vapor phase deposition or by plating, adhesive layer made of chromium, aluminum, titanium or a laminate comprising at least two of chromium, aluminum and titanium, a conductive layer of copper, and a corrosion-preventive and wire bonding layer made of gold, or (3) a laminate formed by laminating, by vapor phase deposition by plating, a conductive layer of aluminum, a diffusion barrier layer made of nickel, and a corrosion-preventive and wire bonding layer made of gold.

Aluminum and copper are metals available at low cost. Generally, gold is used for film wiring. Since gold is a precious metal, it is fairly expensive. Thus, by making the conductive layer from aluminum or copper, the material cost of the board can be reduced markedly. But, in case of the resin-sealed type of IC package, the wirings made of aluminum or copper tend to corrode due to the high hygroscopicity of resin.

Also, a gold wire bonding connection has a problem that intermetallic compounds tend to be produced due to thermal diffusion between gold and aluminum, thereby increasing the electrical resistance and reducing the strength at the connection. A gold-copper connection has a problem in that the bonding properties are not good. Moreover, wiring layers tend to peel off easily due to poor adhesion of the copper wiring layer to the dielectric layer.

According to the present invention, in order to prevent the corrosion of the wirings and to improve the adhesion when bonding with gold wires (by preventing the formation of compounds), an adhesive layer made of chromium, titanium or a laminate thereof is formed on an aluminum layer as a conductive layer, a diffusion barrier layer made of nickel, copper or a laminate thereof is formed further thereon, and a gold layer is further formed thereon. In the alternative, a diffusion barrier layer made of nickel is formed on an aluminum layer as a conductive layer, and a gold layer is further formed thereon.

If the conductive layer is made from copper, an adhesive layer made of chromium, aluminum, titanium or a laminate thereof is formed on the dielectric layer, a conductive layer of copper is formed thereon, and a corrosion-preventive and wire bonding gold layer is laminated further thereon.

These wirings should be formed by vapor phase deposition or by plating, because with these methods, the films can be miniaturized easily, i.e. the wiring width can be easily reduced to 100 microns or less, which is difficult with the screen printing method.

Considering the fact that the wirings have to have a conductivity of 100 m/mm or less, the aluminum or copper layer has to be fairly thick, i.e. 5 microns or more. But their mass-productivity is known to be very high.

The adhesive layer is provided to increase the adhesion between the aluminum conductive layer and the diffusion barrier layer or between the copper conductive layer and the dielectric layer. Its thickness should preferably be between 0.01 micron and 0.5 micron regardless of whether it is made of a single metal or a laminate of different metals. If 0.01 micron or less, sufficient adhesion is difficult to come by. If 0.5 micron or more, the cost for forming the film will become too high.

The thickness of the diffusion barrier layer should be within the range of 0.05 micron or more and 5 microns or less. If the thickness is 0.05 micron or less, no diffusion barrier effect will be manifested. If 5 microns or more, the film forming cost will become too high.

The thickness of the gold film layer should preferably be between 0.05 micron and 0.5 micron. If the thickness is 0.05 micron or less, it will be difficult to expect sufficient corrosion prevention or good wire bonding properties, If 0.5 micron or more, material costs will be too high, thereby increasing the cost of the end product.

The above-described arrangement can offer a wiring board having fine wirings and having good reliability even if it is used in the resin-sealed package. But by forming an inorganic dielectric film made of e.g. alumina as the dielectric layer directly on the metal board, a very thin surface mounting type flat package is obtained. Also, the reliability of the printed wiring board can be kept high because the adhesive layer never softens.

BEST MODE FOR CARRYING OUT THE INVENTION

Figure 1:
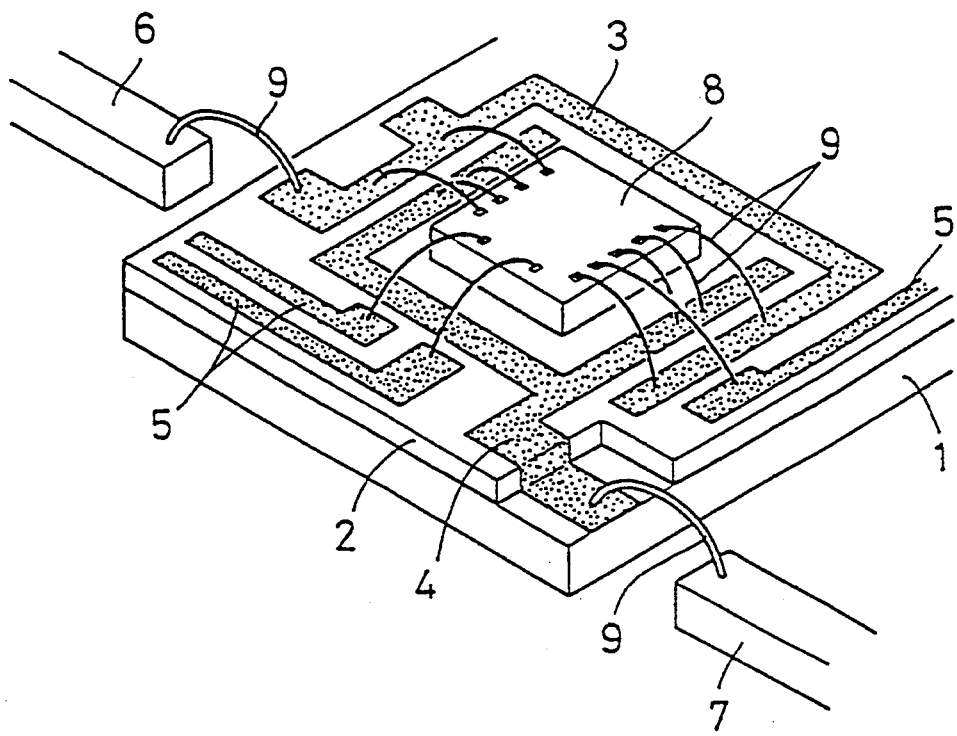
FIG. 1 is a perspective view of one example of the wiring board according to the present invention.

Numeral 1 in the figures designates a metal plate as a base. A thin-film dielectric layer 2 is formed directly on the surface of the metal plate 1. A Vcc wiring 3, a GND wiring 4 and signal (I/O) wirings 5 are formed on the layer 2. The GND wiring 4 extends onto a portion where the dielectric layer 2 has been partially cut out and is connected at this portion to the metal plate 1. Numeral 6 designates a Vcc external lead and 7 a GND external lead. The wirings 3, 4 and 5 are film wirings in the form of laminates having either one of the following three structures: (1) Al/Cr, Ti or a laminate thereof/Ni, Cu or a laminate thereof/Au, (2) Cr, Al, Ti or a laminate comprising at least two of the above metals/Cu/Au, and (3) Al/Ni/Au.

Power source electrodes of a semiconductor element 8 mounted on the dielectric layer 2 are connected to the Vcc wiring 3 through bonding wires 9. Its grounding electrodes are connected to the GND wiring 4. The Vcc wiring 3 and the GND wiring 4 are connected to the Vcc external lead 6 and the GND external lead 7, respectively, through the bonding wires 9. Signal electrodes of the element 8 are eventually connected to a signal external lead (not shown) having a shape similar to the leads 6 and 7. But if the signal wirings 5 are provided as in the embodiment, at least some of the signal electrodes are connected to the external lead via the wirings 5.

With this arrangement, the dielectric layer 2 serves as an insulating layer between the metal plate 1 and wiring 3 and between the wirings 5 and 3 with respect to the direct current source. Thus, a bypass capacitor is created over the entire area where the Vcc wiring 3 is formed with metal plate 1 and wiring 3 as electrodes. This serves to prevent the entry of noise when switching the element 8.

The following is a more detailed description of the preferred embodiments.

Embodiment 1

Figure 2:
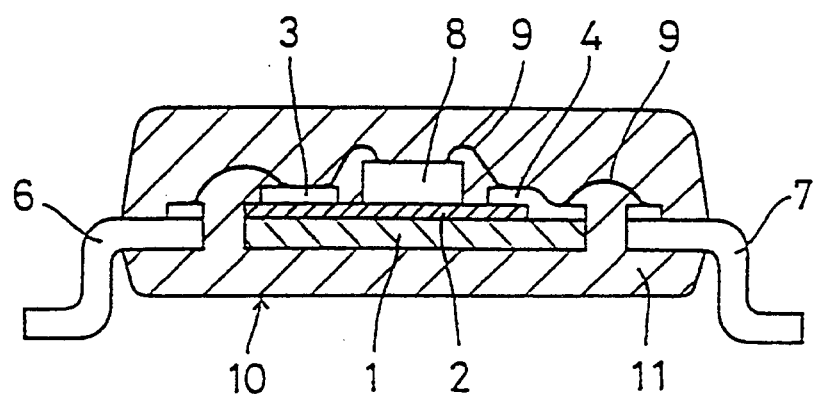
FIG. 2 is a cross-sectional view of one example of a semiconductor device using the wiring board according the present invention.

A surface-mounting type resin-sealed 132-pin flat package (PQFP) 10 (FIG. 2) was prepared which had CMOS digital logic IC as a semiconductor element mounted on the wiring board according to the present invention (shown in FIG. 1). A plastic body of this package was 24×24×4 mm and had 33 external lead pins along each side with the pin pitch of 0.64 mm. The area of the Vcc wiring which corresponds to wiring 3 in FIG. 1 was set to be 40 mm$^2$ in order that the connection with the bonding wire 9 can be made with ease. This wiring area corresponds to the effective electrode area of the bypass capacitor created by the dielectric layer.

The IC used here requires a bypass capacitor having a capacitance of about 500 pF or more. We prepared seven different kinds of wiring boards as shown in Table 1 each having a wiring laminate comprising an aluminum conductive layer/adhesive layer/barrier layer/gold layer structure nine different kinds of wiring boards as shown in Table 2 each having a wiring laminate comprising an adhesive layer/copper conductive layer/gold layer structure and seven different kinds of wiring boards as shown in Table 3 each having a wiring laminate comprising an aluminum conductive layer/nickel barrier layer/gold layer structure. Their performances were tested before assembling.

The test results showed that the wiring board Nos. 1–20, which used $Al_2O_3$ for the dielectric layer, had a capacitance of about 490 pF and that the board Nos. 21–23, which used $SiO_2$, had a capacitance of 480 pF.

Also, none of the PQFP prototypes constructed from these boards produced any problematic signal (I/O) noise waveforms even when the number of simultaneous switchings of the CMOS digital logic ICs was increased. This clearly shows that the wiring boards were functioning normally.

In order to evaluate the reliability, the property test was conducted again after subjecting the samples to a high-temperature shelf test at 150° C. for 1000 hours. Sample Nos. 2–4, 7, 8, 10–15, 15, 16 and 19–23 showed good results. But some malfunctioning was observed for the sample Nos. 1, 5, 6, 9, 14, 17 and 18. We disassembled these samples for checking. It turned out that the malfunctions of the sample Nos. 1, 9, 14 and 18 resulted from a reduction in strength of the bonding surfaces between the gold bonding wires and the wirings due to insufficient thickness of gold film. As for the sample Nos. 5. 6 and 17, diffusion of aluminum into the gold layer because insufficient thickness of the barrier layer was observed. In other words, the barrier layer was not functioning as an effective barrier.

As described above, the wiring board according to the present invention requires less space and its wiring reliability is high. Further, by the use of a composite film structure as a wiring layer with a base of aluminum or copper, the entire board can be manufactured at a low Thus, by using the wiring board according to the present invention for various semiconductor devices, they can be highly integrated, made lighter, thinner, shorter and smaller and can be manufactured at low costs. Thus, the present invention can provide semiconductor devices which satisfy current day requirements.

TABLE 1

| Sample | Wiring layer | | | | Dielectric layer (material/thickness) | Metal plate (material/thickness) |
|---|---|---|---|---|---|---|
| | Al layer | Adhesive layer (material/thickness) | Barrier layer (material/thickness) | Au layer (thickness) | | |
| ① | 5 μm | Cr 0.03 μm | Ni 0.3 μm | 0.03 μm | $Al_2O_3$ 5 μm | $Cu_{alloy}$ 0.15 mm |
| ② | 5 μm | Cr 0.2 μm | Ni 0.3 μm | 0.1 μm | " | " |
| ③ | 5 μm | Ti 0.4 μm | Cu 0.1 μm | 0.1 μm | " | " |
| ④ | 5 μm | Ti 0.02 μm | Cu 0.5 μm | 0.2 μm | " | " |
| ⑤ | 5 μm | Ti 0.2 μm | Cu 0.02 μm | 0.2 μm | " | $42_{alloy}$ 0.25 mm |
| ⑥ | 5 μm | Cr 0.1 μm | Cu 0.03 μm | 0.1 μm | " | " |

TABLE 1-continued

| | | Wiring layer | | Dielectric | Metal |
|---|---|---|---|---|---|
| Sample | Al layer | Adhesive layer (material/ thickness) | Barrier layer (material/ thickness) | Au layer (thickness) | layer (material/ thickness) | plate (material/ thickness) |
| ⑦ | 5 μm | Ti 0.1 μm/ Cr 0.1 μm | Cu 0.1 μm/ Ni 0.4 μm | 0.1 μm | " | " |

TABLE 2

| | Wiring layer | | | Dielectric | Metal |
|---|---|---|---|---|---|
| Sample | Adhesive layer (material/thickness) | Cu layer (thickness) | Au layer (thickness) | layer (material/ thickness) | plate (material/ thickness) |
| ⑧ | Cr 0.03 μm | 5 μm | 0.1 μm | $Al_2O_3$ 5 μm | $Cu_{alloy}$ 0.15 mm |
| ⑨ | Cr 0.1 μm | 5 μm | 0.01 μm | $Al_2O_3$ 5 μm | $Cu_{alloy}$ 0.15 mm |
| ⑩ | Al 10.05 μm | 5 μm | 0.2 μm | $Al_2O_3$ 5 μm | $Cu_{alloy}$ 0.15 mm |
| ⑪ | Al 0.3 μm | 5 μm | 0.3 μm | $Al_2O_3$ 5 μm | $Cu_{alloy}$ 0.15 mm |
| ⑫ | Ti 0.05 μm | 5 μm | 0.2 μm | $Al_2O_3$ 5 μm | $42_{alloy}$ 0.25 mm |
| ⑬ | Ti 0.4 μm | 5 μm | 0.4 μm | $Al_2O_3$ 5 μm | $42_{alloy}$ 0.25 mm |
| ⑭ | Cr 0.2 μm/Al 0.1 μm | 5 μm | 0.03 μm | $Al_2O_3$ 5 μm | $42_{alloy}$ 0.25 mm |
| ⑮ | Ti 0.1 μm/Al 0.3 μm | 5 μm | 0.2 μm | $Al_2O_3$ 5 μm | $42_{alloy}$ 0.25 mm |
| ⑯ | Ti 0.2 μm/Cr 0.1 μm | 5 μm | 0.1 μm | $Al_2O_3$ 5 μm | $42_{alloy}$ 0.25 mm |

TABLE 3

| | Wiring layer | | | Dielectric | Metal |
|---|---|---|---|---|---|
| Sample | Al layer | Ni barrier layer (material/ thickness) | Au layer (thickness) | layer (material/ thickness) | plate (material/ thickness) |
| ⑰ | 5 μm | 0.03 μm | 0.2 μm | $Al_2O_3$ 5 μm | $Cu_{alloy}$ 0.15 mm |
| ⑱ | 5 μm | 0.8 | 0.03 | $Al_2O_3$ 5 μm | |
| ⑲ | 5 μm | 0.4 | 0.1 | $Al_2O_3$ 5 μm | $Cu_{alloy}$ 0.15 mm |
| ⑳ | 5 μm | 1.2 | 0.3 | $Al_2O_3$ 5 μm | $Cu_{alloy}$ 0.15 mm |
| ㉑ | 5 μm | 2.1 | 0.2 | $SiO_2$ 3 μm | $42_{alloy}$ 0.25 mm |
| ㉒ | 5 μm | 3.1 | 0.2 | $SiO_2$ 3 μm | $42_{alloy}$ 0.25 mm |
| ㉓ | 5 μm | 0.5 | 0.1 | $SiO_2$ 3 μm | $42_{alloy}$ 0.25 mm |

We claim:

1. A wiring board comprising a metal plate, a thin film of a dielectric disposed over a surface of said metal plate, and wiring patterns on said dielectric layer, each of said wiring patterns being a laminate including a conductive layer of aluminum, an adhesive layer, a diffusion barrier layer, and a corrosion-preventive wire bonding layer of gold, and wherein said adhesive layer is a chromium layer, a titanium layer or a laminate of chromium and titanium, and said diffusion barrier layer is nickel layer, a copper layer or a laminate of nickel and copper.

2. A wiring board comprising a metal plate, a thin film of a dielectric disposed over a surface of said metal plate, and wiring patterns on said dielectric layer, each of said wiring patterns being a laminate including an adhesive layer, a conductive layer of copper, and a corrosion-preventive wiring bonding layer of gold, and wherein said adhesive layer is a chromium layer, an aluminum layer, a titanium layer or a laminate of at least two materials selected from the group consisting of chromium, aluminum and titanium.

3. A wiring board comprising a metal plate, a thin film of a dielectric disposed over a surface of said metal plate, and wiring patterns formed on said dielectric layer, each of said wiring patterns being a laminate including a conductive layer of aluminum, a diffusion barrier layer of nickel, and a corrosion-preventive wire bonding layer of gold.

4. A wiring board as claimed in any of claim 1 further comprising a lead frame connected to said wiring layers.

5. A wiring board as claimed in claim 1, wherein said thin film is an inorganic dielectric film disposed directly on the surface of said metal plate.

6. A wiring board as claimed in claim 2, further comprising a lead frame connected to said wiring layers.

7. A wiring board as claimed in claim 3, further comprising a lead frame connected to said wiring layers.

8. A wiring board as claimed in claim 2, wherein said thin film is an inorganic dielectric film disposed directly on the surface of said metal plate.

9. A wiring board as claimed in claim 3, wherein said thin film is an inorganic dielectric film disposed directly on the surface of said metal plate.

10. A wiring board as claimed in claim 4, wherein said thin film is an inorganic dielectric film disposed directly on the surface of said metal plate.

11. A wiring board as claimed in claim 6, wherein said thin film is an inorganic dielectric film disposed directly on the surface of said metal plate.

12. A wiring board as claimed in claim 7, wherein said thin film is an inorganic dielectric film disposed directly on the surface of said metal plate.

* * * * *